United States Patent [19]

Acarlar

[11] Patent Number: 4,930,857
[45] Date of Patent: Jun. 5, 1990

[54] HYBRID PACKAGE ARRANGEMENT

[75] Inventor: Muvaffak S. Acarlar, Allentown, Pa.

[73] Assignee: AT&T Bell Laboratories, Murray Hill, N.J.

[21] Appl. No.: 353,922

[22] Filed: May 19, 1989

[51] Int. Cl.$^5$ .............................................. G02B 6/42
[52] U.S. Cl. .................................. 350/96.20; 357/74
[58] Field of Search ................. 350/96.20; 357/74, 75, 357/80

[56] References Cited

U.S. PATENT DOCUMENTS

| | | | |
|---|---|---|---|
| 4,527,010 | 7/1985 | Anazawa et al. | 357/74 X |
| 4,670,770 | 6/1987 | Tai | 357/74 X |
| 4,752,109 | 6/1988 | Gordon et al. | 350/96.20 |
| 4,772,523 | 9/1988 | Mace et al. | 357/74 X |
| 4,835,593 | 5/1989 | Arnold et al. | 357/74 X |

Primary Examiner—John D. Lee
Assistant Examiner—Phan T. Heartney
Attorney, Agent, or Firm—Wendy W. Koba

[57] ABSTRACT

A package arrangement is disclosed which utilizes a multi-layer ceramic (MLC) component subassembly member which extends beyond the periphery of the package sidewalls. The MLC member constains a number of bondpad sites formed on its inner layers to provide for the connection of leads to the package, where the leads do not have to penetrate the package sidewalls. This aspect of the package thus provides improved hermeticity over prior art designs. A metallic base plate is attached to the underside of the MLC and is electrically connected to metallic sidewalls to provide EMI and mechanical protection. The package may be utilized for housing either electronic or optoelectronic components.

12 Claims, 5 Drawing Sheets

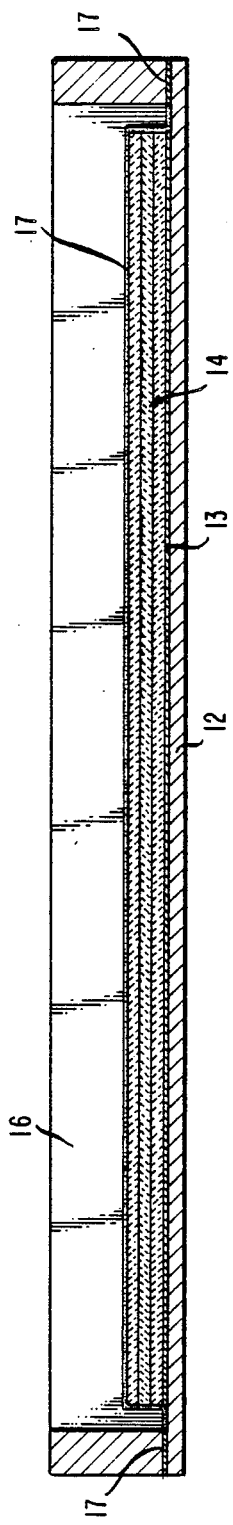
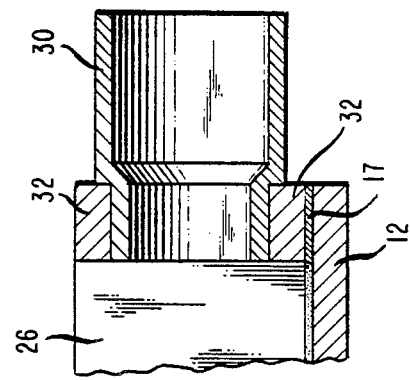
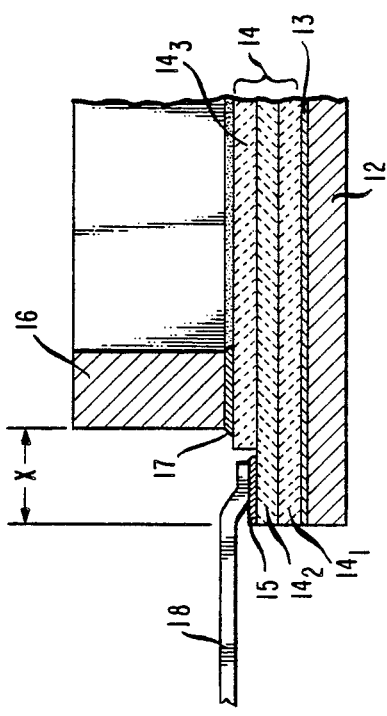
FIG. 3
FIG. 6
FIG. 4

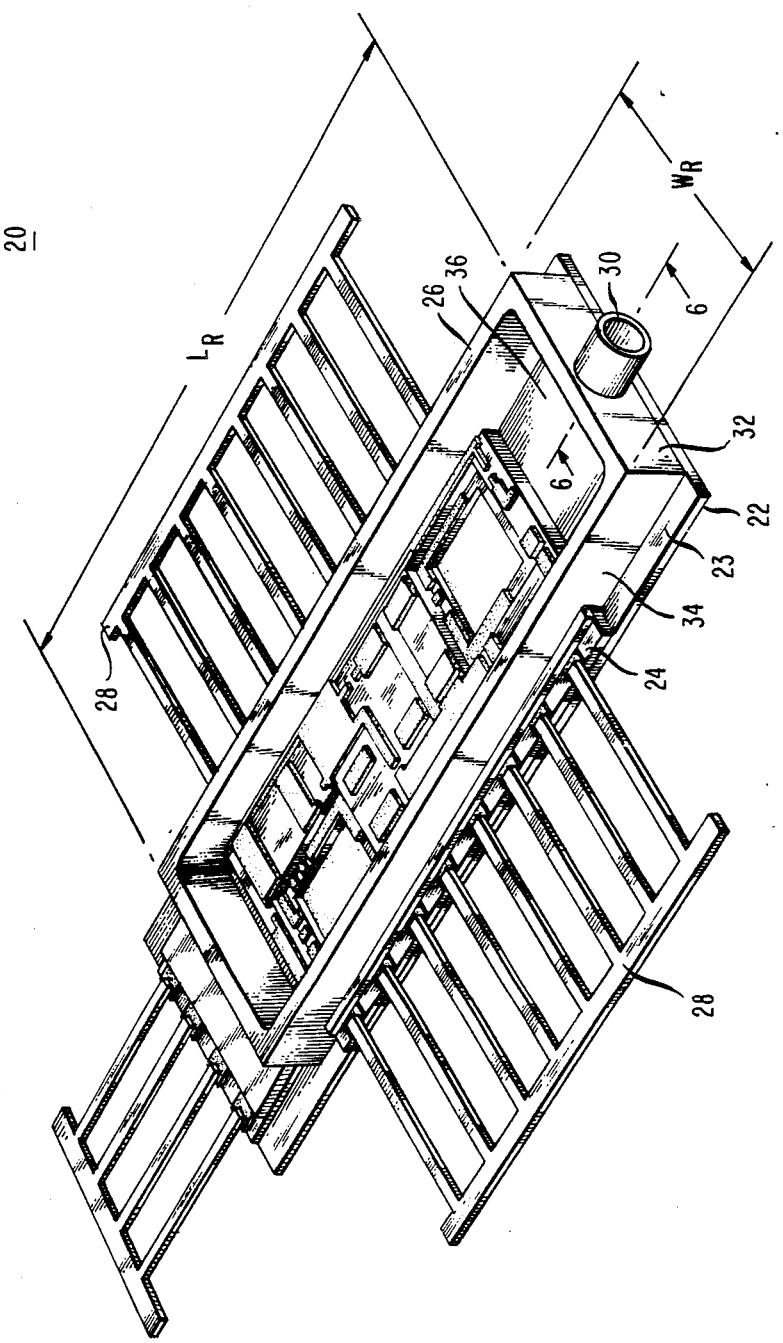

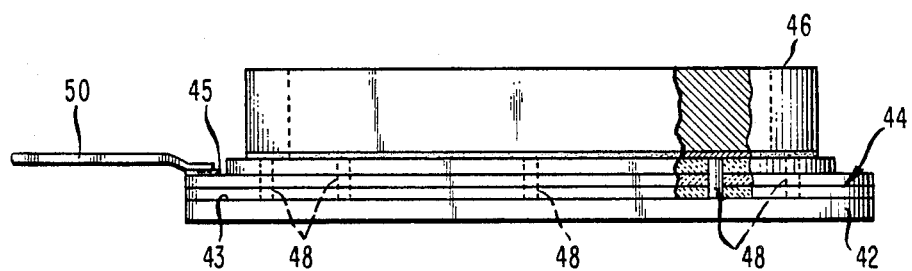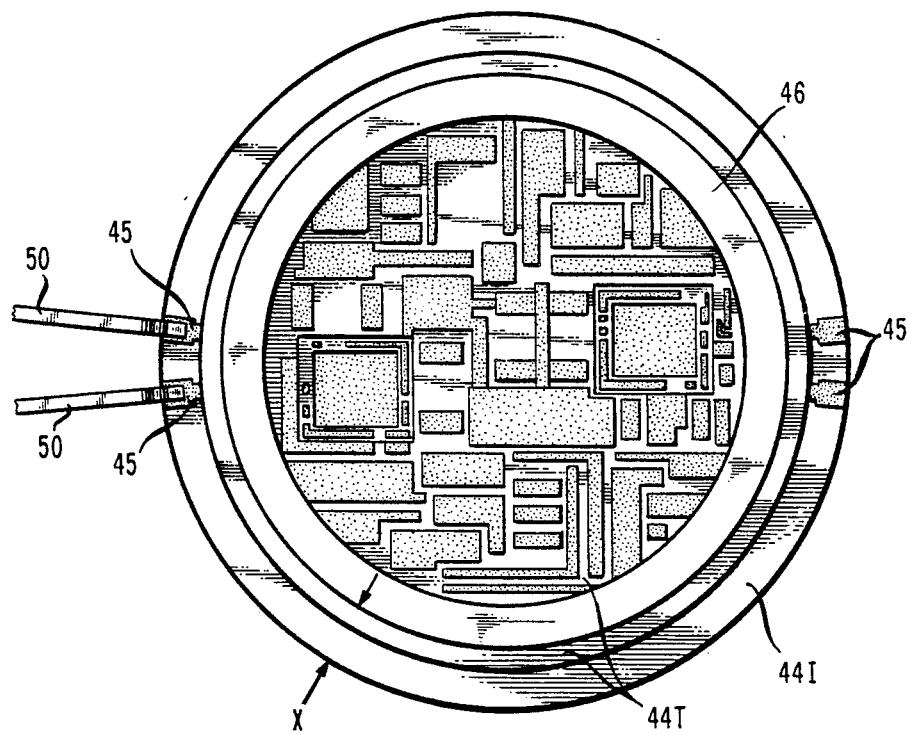

HYBRID PACKAGE ARRANGEMENT

BACKGROUND OF THE INVENTION

1. Field of the Invention

The present invention relates to a packaging arrangement for electronic and/or optoelectronic assemblies and, more particularly, to such a package which advantageously utilizes a multi-layered ceramic (MLC) integrated circuit subassembly member.

2. Description of the Prior Art

Hybrid packages are defined as those packages which are used to house one or more integrated circuits, or chips, as well as other discrete components. These other components may comprise optoelectronic devices such as lasers, LEDs, or photodiodes. There are often many interconnections between devices inside a hybrid package, as well as many connections between the package and external components (e.g., input/output signals, power and ground supplies, test points). Hybrid packages may be classified into two major types: metal and ceramic.

Metal hybrid packages (often referred to as "bathtub packages") are known to be mechanically very rugged and provide inherent electro-magnetic interference (EMI) shielding, good thermal dissipation, and impedance-matched feed-throughs. This type of package may take on any desired configuration and is produced using a variety of standard techniques including casting, stamping, brazing, forming and injection molding. In spite of these advantages, a number of problems exist with the all-metal hybrid package. First, when used for housing a hybrid intergrated circuit (HIC)—the most prevalent application—an epoxying or soldering operation is required to attach the HIC to the bottom of the package. Issues regarding thermal mismatch of the metal package, attachment material (usually an epoxy) and the HIC substrate (usually a ceramic) may arise, where the mismatch may degrade the ability of the metal to transfer away the heat generated by the HIC. Additionally, this type of package requires the use of a large number of wirebonds to connect the various components inside the package, as well as to connect the HIC(s) to the leads which exit the package. It is well-known that the reliability of a package device is directly proportional to the number of wirebond attachments, where a large number of such bonds significantly reduces reliability. Wirebonds attached to incorrect locations, missing wirebonds, broken wirebonds, and shorted wirebonds are just a few examples of the known failure mechanisms. Further, for packages which must be hermetic, the type of sealant used to connect the external leads to the package may be a problem. Glass-to-metal seals are often used for this connection (see "Hybrid Packages Maximize Circuit Protection", *Electronic Packaging and Production*, January 1989, pp. 48 et seq.). In particular, the leads (usually a nickel/gold-plated nickel/iron alloy) are inserted through openings in the package (package base for through-the-board applications or package sidewalls for surface-mount applications), with a glass material used to fill the openings and surround the leads. Various glass materials are utilized to provide either a matched seal (coeffcient of thermal expansion of package, glass, and leads being matched) or a compression seal (coeffcient of thermal expansion of package>glass>leads), the latter providing a better hermetic seal. However, problems exist with these seals, especially when the leads are bent a number of times, or the package is subjected to extremes in temperature fluctuations. These conditions are known to cause cracks to develop between the leads and the glass sealant. These cracks may then propagate through the opening, resulting in a loss of hermeticity.

As an alternative to all-metal hybrid packages, a ceramic package, often referred to as a "flatpack" is used. In this design, a ceramic base, or a multi-layered ceramic (MLC) is utilized as the bottom support piece of the package, with a hybrid integrated circuit (HIC) attached to the base. Alternatively, the base may actually be the HIC itself. In the former case, the HICs may be connected to the MLC, with metallic paths formed on the various layers of the MLC used to replace a large number of the wirebonds required in the all-metal package. Thus, the ceramic package offers an improvement in reliability over the metal package by reducing the number of wirebonds. The sidewalls of the ceramic package comprise a metal which is chosen to match as closely as possible the physical properties (e.g., coefficent of thermal expansion) of the ceramic base. In most cases, a nickel-iron cobalt alloy, known by the trade name kovar ® of Carpenter Technology, is used for this purpose. Major drawbacks associated with this type of package are its lack of protection from electro-magnetic interference (EMI) and mechanical fragility. This lack of protection in the ceramic package limits its usefulness to applications where neither EMI nor mechanical ruggedness are of great concern.

In the light of the above, a need remains in the prior art for a packaging scheme which has increased reliability over metal schemes, while also providing improved EMI shielding over known ceramic arrangements.

SUMMARY OF THE INVENTION

The need remaining in the prior art is addressed by the present invention which relates to a packaging arrangement for electronic and/or optoelectronic assemblies and, more particularly, to such a package which advantageously utilizes a multi/layered ceramic (MLC) subassembly member.

In accordance with one embodiment of the present invention, a package comprises a base plate with at least a conductive top surface upon which is attached an MLC member for providing interconnection between the various components. A metal (or metallic-coated) ring, forming the package walls, is attached to the top surface of the MLC member, as well as any portion of the base plate left exposed by the MLC, where the ring is sized so that portions of the MLC containing bondpad sites extend beyond the periphery of the ring. These exposed bondpad sites are utilized to provide connection to the external leads. It is to be noted that the preferred embodiment, in terms of providing the best hermeticity and EMI protection, is achieved when a metallic base plate and a metallic ring are used.

An advantage of an exemplary package of the present invention is the provision of a lead attachment scheme which does not require through-the-wall connections. In accordance with one utilization of the present invention, leads may be connected to metallic pads on inner layers of the MLC, where metallized runners on the MLC member then provide electrical connection to the necessary locations within the package. Therefore, no sealants (i.e., glass-to-metal) are required to connect the leads to the package. Thus, the hermeticity problems associated with conventional all-metal packages are alleviated.

Another advantage associated with the inventive package is its flexiblity in modifying the design in terms of the number of lead connections. That is, the number and location of bondpad sites may be adjusted as need be as the package is utilized for housing different components.

Yet another advantage of the inventive package is that the metallic ring is directly connected to the metallic base to provide the EMI protection which cannot easily be achieved with the conventional ceramic package.

In one embodiment of the present invention especially suited for optoelectronic applications, a separate fiber feed-through piece, formed of copper, is brazed to the ring to allow for a through-the-wall insertion of an optical fiber. Conventional packages which utilized other materials for this feed-through piece have been found to develop cracks with a solder attachment (lack of match between the coefficients of thermal expansion between the solder used and the fiber feed-through piece) when subjected to extreme temperature cycling.

Other and further advantages and embodiments of the present invention will become apparent during the course of the following discussion and by reference to the accompanying drawings.

BRIEF DESCRIPTION OF THE DRAWING

Referring now to the drawings, where the like numerals represent like parts in several views:

FIG. 3 illustrates a side view of the exemplary package, taken along line 3—3 of FIG. 1;

FIG. 4 illustrates a detail view of a portion of the exemplary package, taken along line 4—4 of FIG. 1;

FIG. 5 illustrates an alternative packaging arrangement of the present invention, especially suited for optoelectronic apllications;

FIG. 6 illustrates a detail view of a portion of the alternative packaging arrngements for optoelectronic applications, taken along line 6—6 of FIG. 5;

FIG. 7 contains a side view of yet another embodiment of a hybrid package formed in accordance with the present invention; and FIG. 8 illustrates a top view of the package of FIG. 7.

DETAILED DESCRIPTION

Figure 1:
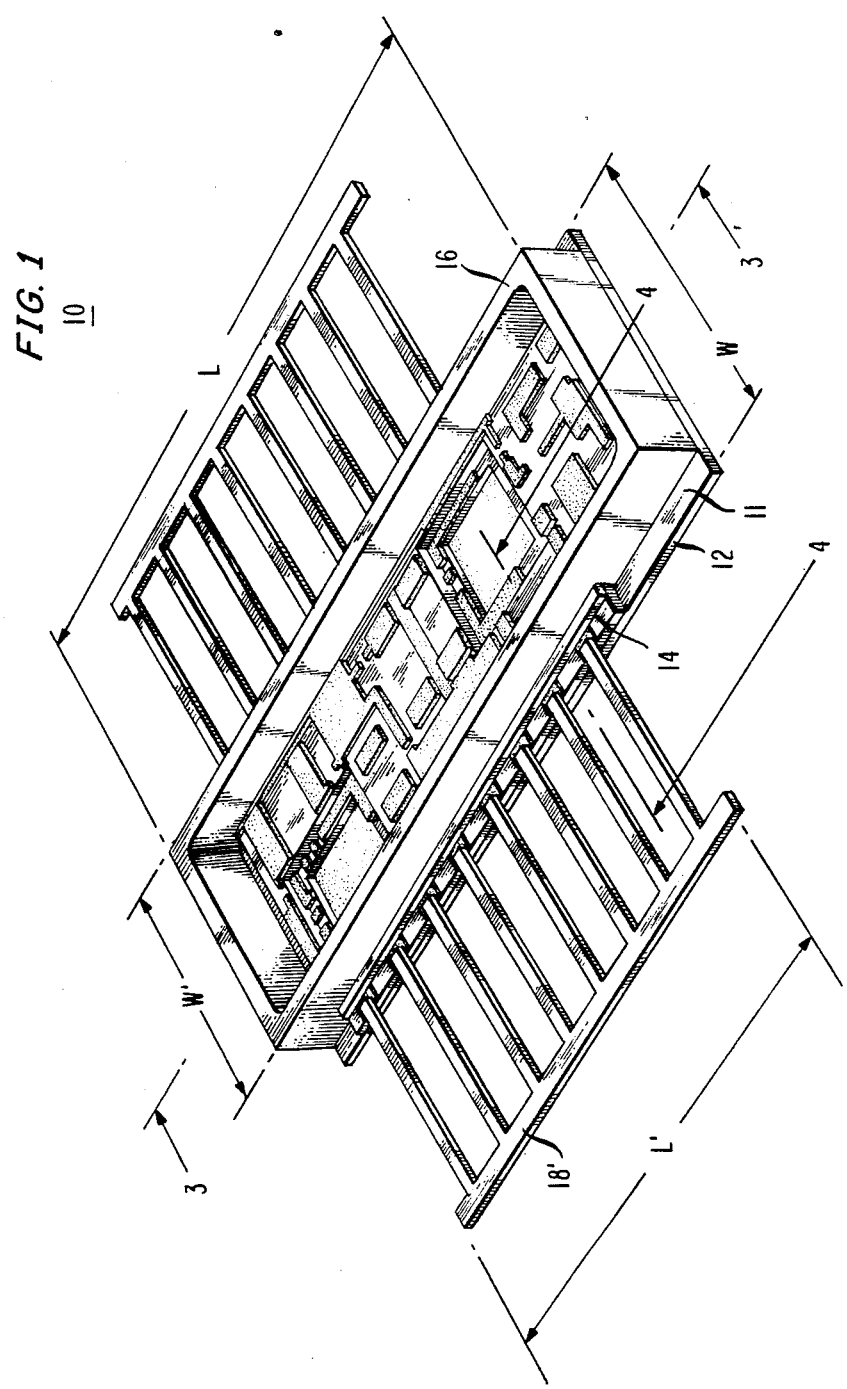
FIG. 1 contains an isometric view of an exemplary package formed in accordance with the present invention.

An exemplary package 10 formed in accordance with the present invention illustrated in FIG. 1. As shown, package 10 includes a base plate 12 with a conductive top layer 11. Base plate 10 is illustrated as having a predetermined width W and length L. In a preferred embodiment, base plate 12 is formed of a metal such that the inclusion of a top conductive layer 11 is unnecessary. A multi-layer ceramic (MLC) component subassembly member 14 is attached to conductive top layer 11 of base plate 12, where the underside of MLC member 14 has been metallized so that base 12 and MLC 14 may be brazed together. As shown, MLC member 14 comprises essentially the same width W as base 12, but is shorter, having a length L'. It is to be understood that the length of MLC 14 is a function only of design, considering the number of components attached to MLC member 14 and the number of bondpad sites formed therein.

MLC member 14 may comprise any number of separate ceramic layers, with appropriate metallized runners formed on the various surfaces, as well as between layers by means of appropriately placed vias (electrically conductive holes through the layers). The techniques of forming a hybrid integrated circuit (HIC) with MLC technology is well-known and need not be discussed in detail in order to gain an understanding of the packaging techniques of the present invention.

A metal (or metallic-coated) ring 16 is positioned to contact the top and exposed side surfaces of MLC member 14, as well as the exposed top surface portions of base 12, as shown in FIG. 1. If it is desired to provide a hermetic package, ring 16 should be brazed to base 12 and MLC 14. As shown in FIG. 1, ring 16 is formed to comprise a width W' which is less than the width W of base 12 and member MLC 14. Thus, a portion of base 12 and MLC 14 will remain exposed. As discussed above, this exposure is advantageously utilized in accordance with the present invention to allow for a plurality of leads 18 to be attached to MLC 14 without penetrating the package sidewalls formed by ring 16. As will be discussed below in association with FIG. 3, leads 18 are attached to inner layer(s) of MLC member 14 so that at least one top layer of ceramic material provides electrical isolation between leads 18 and ring 16.

An advantage of this aspect of the present invention is that the number of leads, as well as their location, may be changed as required, without modifying other portions of the package. Package 10 of FIG. 1 shows leads 18 attached to both sidewalls of the package. It is to be understood that various other designs are possible, including leads attached to portions of MLC member 14 which are exposed beyond the front and/or back walls of the package, as shown in Fig. 5.

Figure 2:
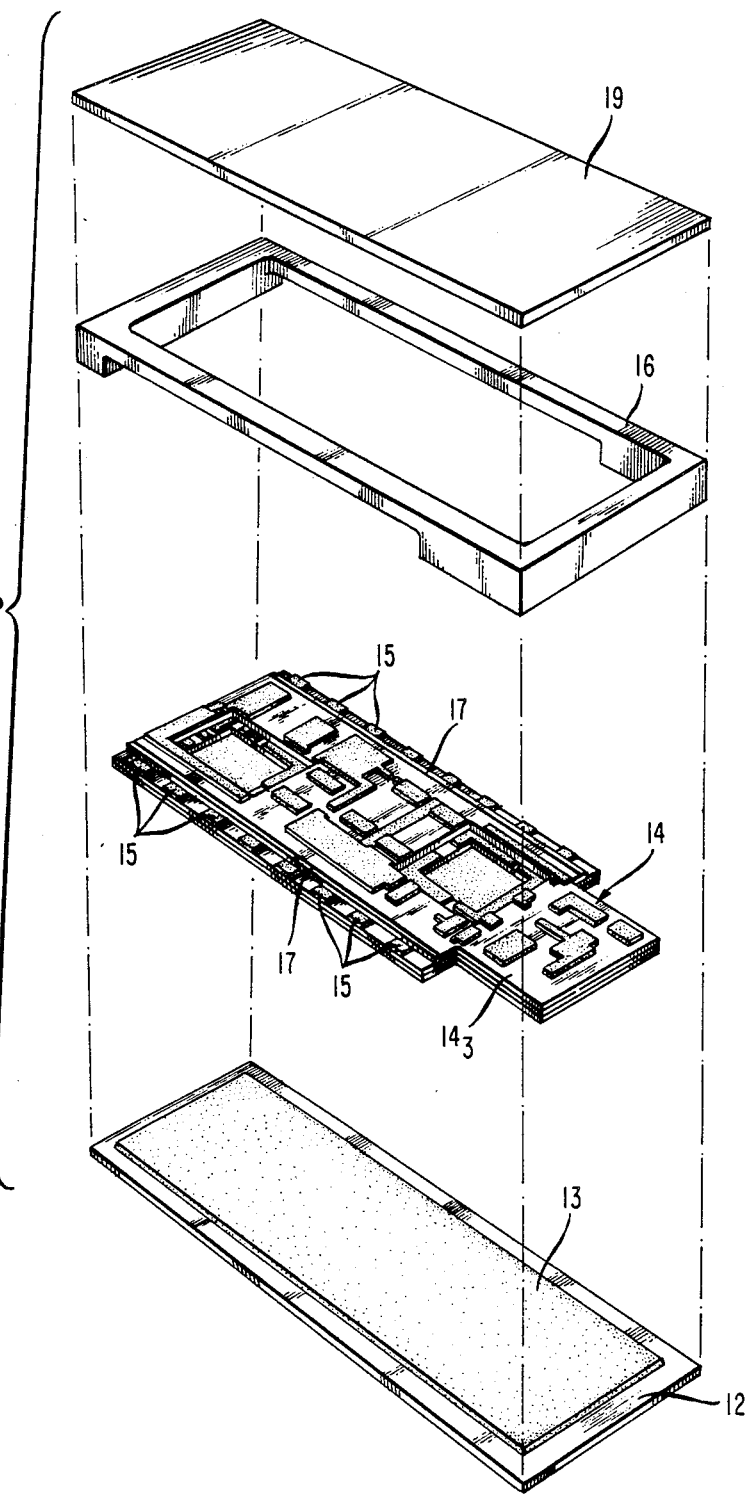
FIG. 2 illustrates an exploded view of the package of FIG. 1.

An exploded view of package 10 is illustrated in FIG. 2, where leads 18 have been omitted for clarity. Base plate 12, which in this view may comprise an alloy such as copper-tungsten, does not require a top conductive layer. A brazing layer 13, which may comprise a copper-silver alloy, is deposited on top of base plate 12 and is used as discussed above to attach MLC member 14 to base 12. It is to be noted that although base 12 is illustrated as having a rectangular shape, any other appropriate topology may also be utilized. One specific embodiment which utilizes a circular package will be described in detail below in association with FIGS. 7 and 8.

Referring back to FIG. 2, MLC member 14 is illustrated as containing a number of openings for the placement of integrated circuit components. Conductive areas on MLC 14 are used to provide electrical interconnections, where as mentioned above, gold-filled vias are used to provide vertical connections between the ceramic layers. In general, the number of separate ceramic layers forming MLC member 14 is controlled by the number of interconnections, where additional layers may be used to avoid electrical crossovers or crossunders on a single surface. The top layer of MLC 14 member (denoted $14_3$), as shown in FIG. 2, is slightly indented from the underlying layers so that leads 18 (not shown) may be attached (brazed or soldered) to bondpad sites 15 formed on one or more inner ceramic layers of MLC member 14. The top layer of MLC 14 also includes a ring of brazing material 17 which is used to provide attachment of ring 16 to MLC 14. As discussed above, ring 16 is sized so as to allow the portions of MLC member 14 containing bondpad sites to remain exposed. A cover plate 19, preferably formed from the same material as ring 16, is then attached to ring 16 to form the completed package. To provide hermeticity, cover plate 19 may be welded or soldered to ring 16. alternatively, ring 16 and cover 19 may be formed as a single piece-part.

FIG. 3 contains a side view of package 10, taken along line 3—3 of FIG. 1. As shown, ring 16 is formed to be flush with the top of base plate 12, as well as the side surfaces and top surface of MLC member 14. As mentioned above, base 12 is preferably formed of a copper-tungsten alloy and ring 16 of Kovar, where these materials have been found to withstand temperature cycling over a broad range (e.g., −65° C. to 150° C.) without causing the ceramic material of MLC member 14 to be cracked. Numerals 13 and 17 outline the brazing attachment of MLC member 14 to base 12 and ring 16 to MLC member 14 and base 12 respectively.

An alternative cross-sectional view of package 10 is illustrated in FIG. 4, which shows in detail the connection of a single lead 18 to MLC member 14. In this specific example, MLC 14 comprises three separate ceramic layers. A first layer $14_1$ is illustrated as being attached to base 12. A second layer $14_2$ is formed to cover first layer $14_1$ and includes bond pad sites 15, as well as other metalizations (not shown). A third (top) ceramic layer $14_3$ is formed to cover a portion of second layer $14_2$, where as shown in FIG. 4, the edge of layer $14_2$ containing bondpad sites 15 is left exposed. A lead 18 is illustrated as attached (e.g., brazed) to bondpad site 15. Ring 16 is attached as shown to brazing material 17 on the top surface of layer $14_3$. As shown, ring 16 is formed so as to allow a portion of MLC 14 of length X (for example, 0.030 inches) to extend outside the periphery of ring 16. As discussed above, an advantage of this aspect of the present invention is that leads 18 may be connected to package 10 without intruding through ring 16, where ring 16 may be considered as the "sidewalls" of package 10. Top ceramic layer $14_3$ is useful in this arrangement to provide isolation (electrical) between leads 18 and ring 16.

An alternative embodiment of the present invention, especially suited for lightwave communication applications, is illustrated in FIG. 5. As shown, package 20 comprises a base plate 22 (and, if base plate 22 is non-metallic, a conductive top layer 23), an MLC subassembly member 24, and a metal (or metallic-coated) ring 26. A plurality of leads 28 are attached to appropriate inner layers of MLC 24. These components may be similar in composition and design to their counterparts as described above in association with FIGS. 1–4. As an accommodation to lightwave applications, ring 26 is formed to include fiber feed-through 30, illustrated as positioned through wall 32 of ring 26. Fiber feed-through 30 is utilized to allow an optical fiber (not shown) to pass through the package 20 and be attached to an optoelectronic device (not shown) placed in package 20. It is to be understood that such a feed-through 30 may also be formed through a sidewall 34 of package 20. Package 20 further includes a cavity 36 between feed-through 30 and MLC 24 to allow for the insertion and attachment of a separate optical subassembly (not shown). In particular, for a transmitter package, the optical subassembly may comprise a mounted laser diode, or a light emitting diode (LED), with appropriate lensing and monitoring, with a fiber attached thereto. Wirebonds may then be used to attach the laser or LED to various driver and monitoring circuits formed on MLC member 24. A lightwave receiver package could utilize a light detecting device (e.g., photodiode) in place of the laser or LED. Alternatively, MLC member 24 may be sized so as to allow for the optical subassembly to be directly mounted thereon.

As shown in FIG. 5, ring 26 is formed to comprise both a narrower width $W_R$ and shorter length $L_R$ than base 22 and MLC 24. This particular embodiment is utilzed when bondpad sites 15 are formed at the rear of the package. As with package 10, ring 26 may be brazed to MLC 24 to provide hermeticity.

FIG. 6 contains a detailed illustration of the attachment of feed-through 30 to ring 26, taken along line 6—6 of FIG. 5. In this particular embodiment, feed-through 30 is brazed to wall 32 of ring 26, where ring 26 preferably comprises Kovar. Instead of also forming feed-through 30 of Kovar, it has been found that it is advantageous to form feed-through 30 of a material which has a coefficient of thermal expansion more closely matched to that of the soldering material in order to provide hermeticity over a large temperature range. For most applications, the solder used is 63% tin, 37% lead (by weight). It has been found that using a copper feed-through 30 best matches the expansion of the solder and will provide a satisfactory hermetic seal.

As mentioned above, the package of the present invention, which utilizes a multi-layered ceramic member extending beyond the periphery of the package sidewalls, may comprise a number of different topologies. An exemplary circular package 40 is illustrated in FIGS. 7 and 8. FIG. 7 contains a side view of package 40, which comprises a base plate 42 (and, if base plate 42 is non-metallic, a conductive top layer 43), an MLC member 44 and metal (or metallic-coated) ring 46. In this particular configuration, ring 46 is sized so that the entire perimeter of MLC member 44 remains exposed. That is, ring 46 is not in direct contact with base plate 42 for this configuration. In order to provide EMI protection, however, ring 46 and plate 42 must be electrically connected. This electrical connection may be accomplished by including a large number of vias 48 through the thickness of MLC member 44 (a technique often referred to in the art as "fencing").

In order to provide electrical connection to external components, a plurality of leads 50 are attached to appropriate inner layers of MLC member 44. As with package 20, circular package 40 may also be formed to include a through-the-wall feed for insertion of an optical fiber. A top of package 40 is illustrated in FIG. 8. As shown, ring 46 is designed to be set back a distance X from the underlying base plate 42 and MLC member 44 (base plate 42 being obscured in this view by the overlying ceramic layers). Top layer $44_T$ of MLC 44 is illustrated as being indented from inner ceramic layers $44_I$ so as to allow for the interconnection of leads 50 to bondpad sites 45.

I claim:

1. A package for providing interconnection between at least one internal component disposed within said package, as well as interconnection between said at least one internal component and at least one external component, a plurality of leads being used to provide the interconnection between the internal and external components, said package comprising a base plate having at least a conductive top surface;

a multi-layer ceramic (MLC) member disposed over said base plate and including sites for placement of said at least one internal component, said MLC member including metallized sections for providing interconnection between said internal components and a plurality of bondpad sites located along the periphery thereof, said plurality of bondpad sites utilized to provide interconnection between said internal and external components; and a ring sidewall comprising at least a conductive outer coating, said ring being disposed over said MLC member and said base plate in a manner such that the periphery of said ring defines the internal portion of said package, said ring formed so as to expose at least the portions of said MLC member which contain bondpad sites without exposing any internal component-containing sites.

2. A package as defined in claim 1 wherein the base plate comprises a metal.

3. A package as defined in claim 2 wherein the metallic base plate comprises a copper-tungsten alloy.

4. A package as defined in claim 1 wherein the ring comprises a metal.

5. A package as defined in claim 4 wherein the metallic ring sidewall comprises a combination of cobalt, nickel, and iron.

6. A package as defined in claim 1 wherein the package is utilized in lightwave systems which require the connection of an optical fiber, said package further including a fiber feed-through portion formed through a section of the ring sidewall.

7. A package as defined in claim 6 wherein the fiber feed-through comprises copper.

8. A package as defined in claim 1 wherein the package further includes a cover plate attached to the ring.

9. A package as defined in claim 8 wherein the cover plate comprises the same material as the ring.

10. A package as defined in claim 8 wherein hermeticity is achieved by welding or soldering together the base plate, the MLC member, the ring, and the cover plate.

11. A package as defined in claim 1 wherein the package further comprises a plurality of leads attached to the exposed bondpad sites.

12. A hybrid package for providing interconnection between a plurality of internal components disposed within said package, as well as interconnection between said internal components and a plurality of external components, a plurality of leads being used to provide the interconnection between the internal and external components, said hybrid package comprising a metallic base plate;

a multi-layer ceramic member disposed over said base plate and including sites for placement of said plurality of internal components, said MLC member including metallized sections for providing interconnection between said internal components and a plurality of bondpad sites located along the periphery thereof, said plurality of bondpad sites utilized to provide interconnection between said internal and external components;

a metallic ring sidewall disposed over said multi-layer ceramic member and said metal base plate in a manner such that the periphery of said metallic ring defines the internal portion of said hybrid package, said metallic ring formed so as to expose at least the portion of said multilayer ceramic member which contain bondpad sites without exposing any component-containing sites;

a metallic cover plate attached to the top surface of said metallic ring; and a plurality of leads attached to the exposed bondpad sites.

* * * * *